(12) United States Patent
Stutterheim et al.

(10) Patent No.: US 10,700,227 B2
(45) Date of Patent: Jun. 30, 2020

(54) FLEXIBLE PHOTOVOLTAIC APPARATUS

(71) Applicant: FLISOM AG, Niederhasli (CH)

(72) Inventors: Stephan Stutterheim, Wallisellen (CH); Andreas Bogli, Vogelsang (CH); Ivan Sinicco, Altendorf (CH); Satish Palika, Zofingen (CH)

(73) Assignee: FLISOM AG, Niederhasli (CH)

( * ) Notice: Subject to any disclaimer, the term of this patent is extended or adjusted under 35 U.S.C. 154(b) by 0 days.

(21) Appl. No.: 16/067,089

(22) PCT Filed: Jan. 4, 2017

(86) PCT No.: PCT/IB2017/000006
§ 371 (c)(1),
(2) Date: Jun. 28, 2018

(87) PCT Pub. No.: WO2017/118905
PCT Pub. Date: Jul. 13, 2017

(65) Prior Publication Data
US 2019/0027624 A1     Jan. 24, 2019

Related U.S. Application Data

(60) Provisional application No. 62/275,588, filed on Jan. 6, 2016.

(51) Int. Cl.
*H01L 31/0392* (2006.01)
*H01L 31/0443* (2014.01)
(Continued)

(52) U.S. Cl.
CPC .. *H01L 31/03928* (2013.01); *H01L 31/03926* (2013.01); *H01L 31/046* (2014.12);
(Continued)

(58) Field of Classification Search
CPC ........ H01L 31/03926; H01L 31/03928; H01L 31/0749; H01L 31/048; H01L 31/0443; H01L 31/046
See application file for complete search history.

(56) References Cited

U.S. PATENT DOCUMENTS 4,537,838 A    8/1985 Jetter et al.
5,782,994 A    7/1998 Mori et al.
(Continued)

FOREIGN PATENT DOCUMENTS

CN    102315293 B    9/2013
DE    10356690 A1    2/2005
(Continued)

OTHER PUBLICATIONS

International Search Report and Written Opinion for PCT/IB2017/000006, dated May 11, 2017.
(Continued)

*Primary Examiner* — Golam Mowla
(74) *Attorney, Agent, or Firm* — Patterson & Sheridan, LLP

(57) ABSTRACT

A flexible photovoltaic apparatus is provided including a photovoltaic device that includes an array of photovoltaic cells having a first end and a second end. The array extends in a first direction from the first end to the second end. The photovoltaic apparatus further includes a first fabric that includes an insulating fabric, a first conductor disposed in the insulating fabric and connected to the first end of the array, and a second conductor disposed in the insulating fabric and connected to the second end of the array.

7 Claims, 14 Drawing Sheets

(51) Int. Cl.
  *H01L 31/046* (2014.01)
  *H01L 31/048* (2014.01)
  *H02S 40/36* (2014.01)
  *H02S 40/34* (2014.01)
  *H01L 31/0749* (2012.01)

(52) U.S. Cl.
  CPC ........ *H01L 31/048* (2013.01); *H01L 31/0443* (2014.12); *H01L 31/0749* (2013.01); *H02S 40/34* (2014.12); *H02S 40/36* (2014.12); *Y02E 10/541* (2013.01); *Y02P 70/521* (2015.11)

(56) References Cited

U.S. PATENT DOCUMENTS

| | | | |
|---|---|---|---|
| 8,569,614 | B2 | 10/2013 | Kang et al. |
| 2002/0179231 | A1 | 12/2002 | Weder |
| 2003/0039035 | A1 | 2/2003 | Yoshikawa et al. |
| 2008/0053522 | A1 | 3/2008 | Basol |
| 2010/0154857 | A1* | 6/2010 | Tell .................... H01L 31/0392 136/244 |
| 2011/0290304 | A1 | 12/2011 | Daniel |
| 2012/0180844 | A1 | 7/2012 | Ward, III |
| 2012/0186624 | A1 | 7/2012 | Lee |
| 2013/0145588 | A1 | 6/2013 | Nakata |
| 2014/0154857 | A1 | 6/2014 | Tilke |
| 2014/0338721 | A1 | 11/2014 | Parent et al. |
| 2015/0349161 | A1 | 12/2015 | Morad et al. |
| 2015/0365046 | A1* | 12/2015 | Lerner .................... H02S 30/20 136/251 |
| 2016/0064587 | A1 | 3/2016 | Hashimoto |

FOREIGN PATENT DOCUMENTS

| | | |
|---|---|---|
| DE | 102009022641 A1 | 11/2010 |
| DE | 112014003918 T5 | 5/2016 |
| EP | 0002816 | 7/1979 |
| EP | 2234177 A1 | 9/2010 |
| EP | 2565938 A1 | 3/2013 |
| EP | 2669954 A1 | 12/2013 |
| EP | 2827382 | 1/2015 |
| JP | 2012231009 A | 11/2012 |
| JP | 2015142096 A | 8/2015 |
| WO | 2008134677 A1 | 11/2008 |
| WO | 20130040036 A1 | 3/2013 |
| WO | 2015029657 A1 | 3/2015 |
| WO | 20150114498 A1 | 8/2015 |

OTHER PUBLICATIONS

International Search Report and Written Opinion for PCT/IB2016/001761, dated Mar. 29, 2017.
International Search Report and Written Opinion for PCT/IB2016/001765, dated Mar. 31, 2017.

* cited by examiner

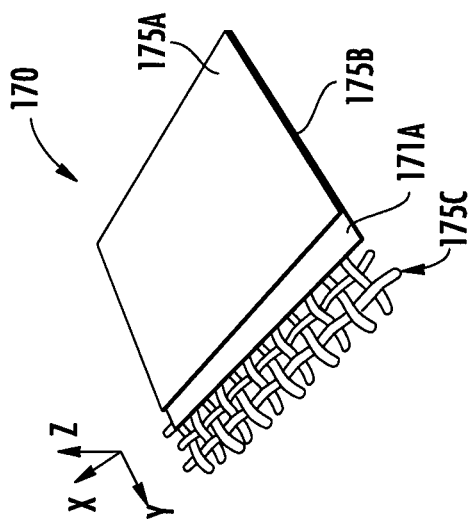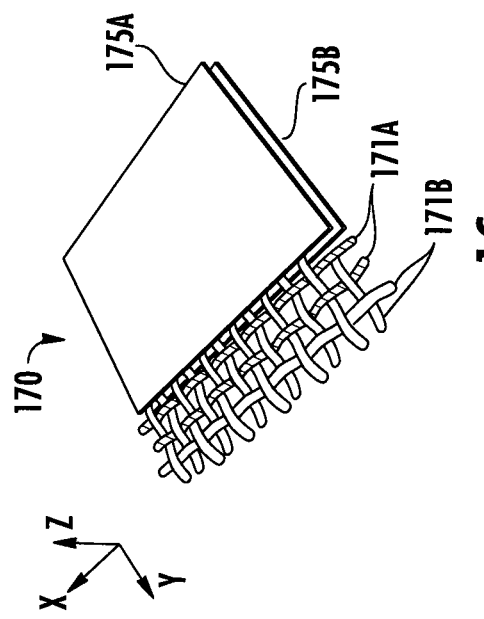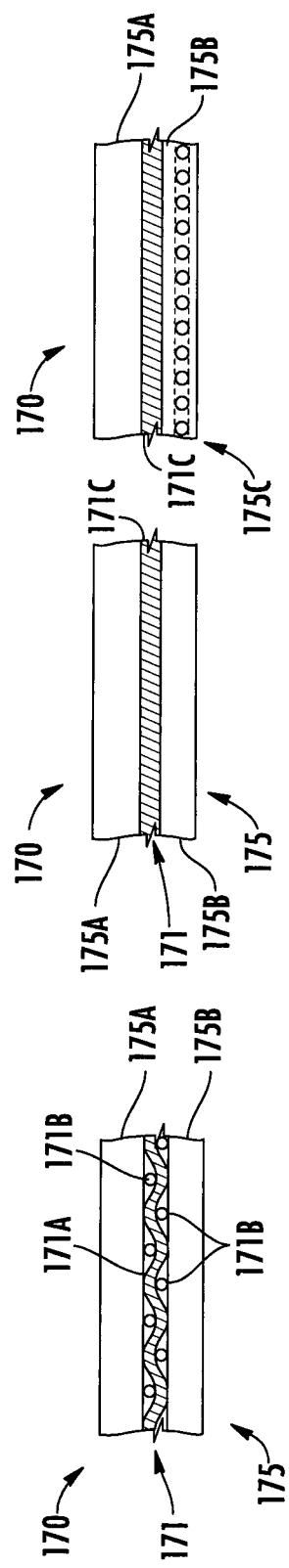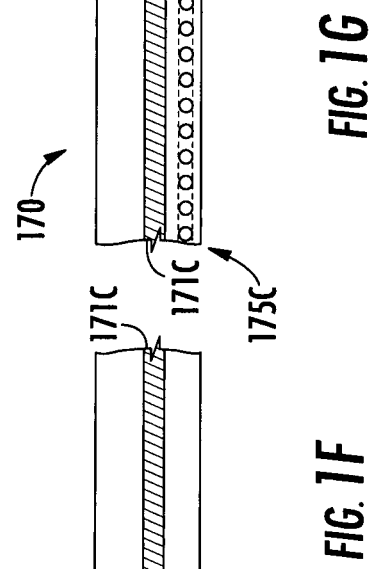

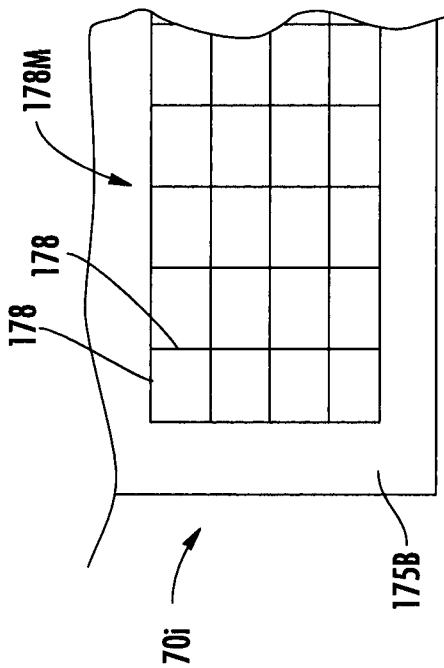
FIG. 1H
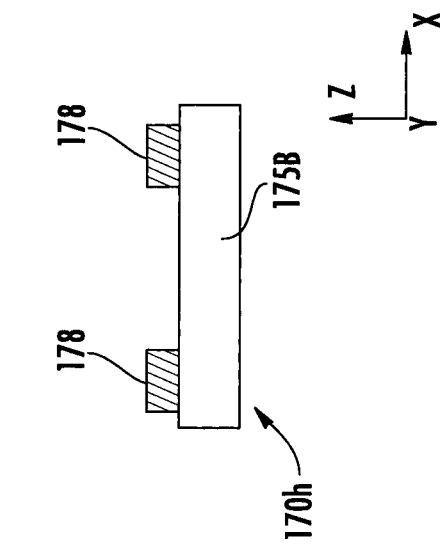
FIG. 1J
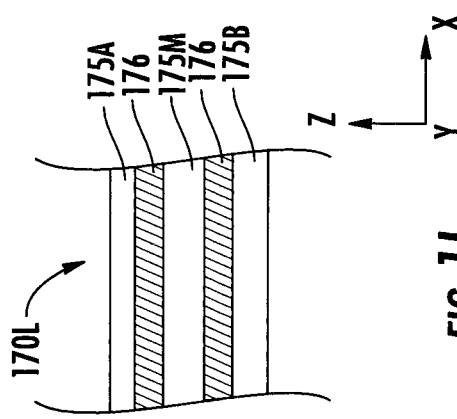
FIG. 1I
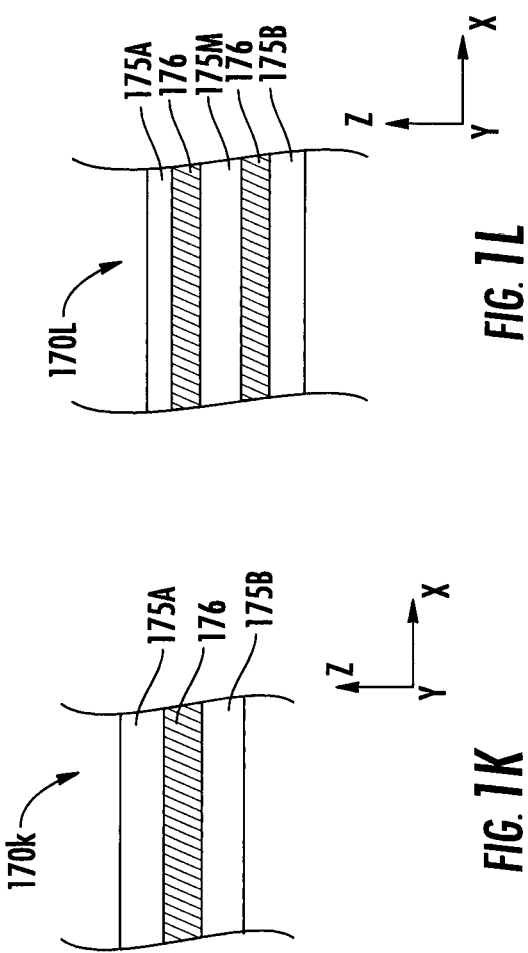
FIG. 1K
FIG. 1L

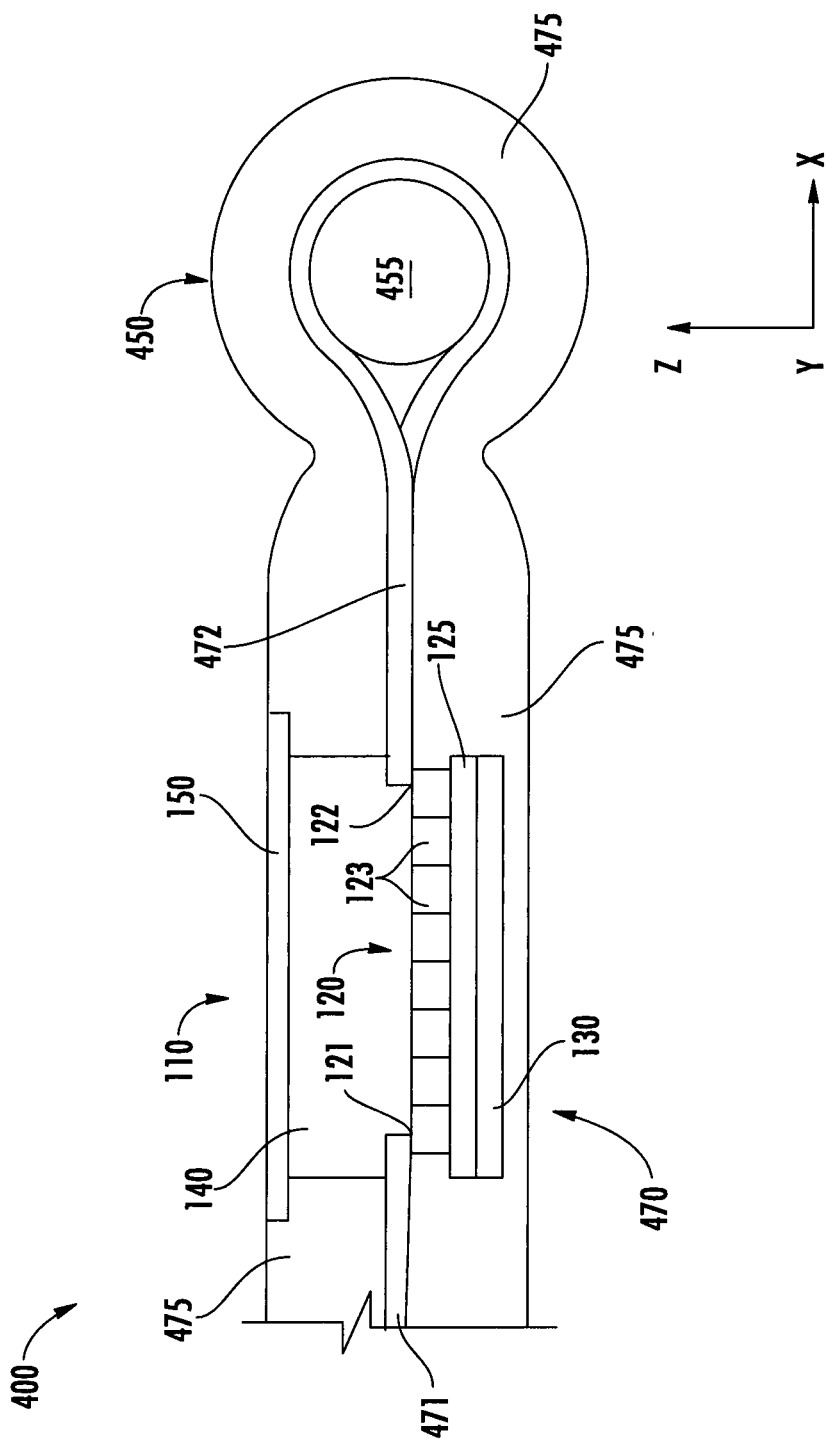

FLEXIBLE PHOTOVOLTAIC APPARATUS

CROSS-REFERENCE TO RELATED APPLICATIONS

This application is a continuation of International Application No. PCT/IB2017/000006, filed Jan. 4, 2017, which is a continuation of U.S. Application No. 62/275,588, filed Jan. 6, 2016. The above applications are all incorporated by reference herein.

BACKGROUND

Field

Embodiments of the present disclosure generally relate to a flexible photovoltaic apparatus.

Description of the Related Art

Photovoltaic apparatuses have conventionally employed a rigid layer of crystalline silicon as the active photovoltaic layer in the apparatus. More recently, thin-film photovoltaic apparatuses using flexible photovoltaic layers, such as layers of $Cu(In,Ga)Se_2$ semiconductor also known as CIGS, have been developed to compete with conventional photovoltaic apparatuses. To extract electrical power from both conventional and thin-film photovoltaic apparatuses, flat and rigid busbars are frequently connected between the photovoltaic devices in the photovoltaic apparatus and a junction box mounted to the photovoltaic apparatus. Providing an electrical connection to a photovoltaic apparatus through the use of flat and rigid busbars and a junction box is a time consuming and inefficient process that often requires one or more manual steps or specialized equipment to automate. Also, the more electrical connections within an electrical circuit in a photovoltaic apparatus, typically the greater the series resistance in the electrical circuit (e.g., contact resistance issues) and the less reliable and repeatable the formed electrical circuit is, which can lead to production yield and lifetime issues of the formed photovoltaic device.

Advantageously, thin-film photovoltaic apparatuses can largely be manufactured using a roll to roll process in which layers are sequentially added over a flexible substrate and then the finished product can be wound into a roll, simplifying storage and transport of the apparatus. Despite the benefits of using a roll-to-roll process, thin-film photovoltaic apparatuses have continued to use junction boxes and rigid busbars to make electrical connections due to the reliability of these electrical connections and because junction boxes can effectively be sealed to prevent moisture from damaging the interior components of the photovoltaic apparatuses.

Therefore, there is a need for an improved photovoltaic apparatus that provides electrical connections within the photovoltaic apparatus and to external equipment without the use of rigid busbars or junction boxes while still preventing moisture from damaging the interior components of the photovoltaic apparatus.

SUMMARY

Embodiments of the present disclosure generally relate to an apparatus having one or more photovoltaic devices disposed on a flexible supporting material. In one embodiment, a flexible photovoltaic apparatus is provided including a photovoltaic device that includes an array of photovoltaic cells having a first end and a second end. The array extends in a first direction from the first end to the second end. The photovoltaic apparatus further includes a first fabric that includes an insulating fabric, a first conductor disposed in or on the insulating fabric and connected to the first end of the array, and a second conductor disposed in the insulating fabric and connected to the second end of the array.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1C is an isometric view of a portion of a fabric that may be disposed within a flexible photovoltaic module assembly, according to one embodiment.

FIG. 1D is a side cross-sectional view of a portion of the fabric illustrated in FIG. 1C, according to one embodiment.

FIG. 1E is an isometric view of a portion of a fabric that may be disposed within a flexible photovoltaic module assembly, according to one embodiment.

FIG. 1F is a side cross-sectional view of a portion of the fabric illustrated in FIG. 1E, according to one embodiment.

FIG. 1G is a side cross-sectional view of an alternate configuration of a portion of the fabric illustrated in FIG. 1E, according to one embodiment.

FIG. 1H is a side view of a fabric that may be disposed within a flexible photovoltaic module assembly, according to one embodiment.

FIG. 1I is a partial top view of a fabric that may be disposed within a flexible photovoltaic module assembly, according to one embodiment.

FIG. 1J is a partial side view of a fabric that may be disposed within a flexible photovoltaic module assembly, according to one embodiment.

FIG. 1K is a partial side view of a fabric that may be disposed within a flexible photovoltaic module assembly, according to one embodiment.

FIG. 1L is a partial side view of a fabric that may be disposed within a flexible photovoltaic module assembly, according to one embodiment.

FIG. 4 is a cross sectional view of a flexible photovoltaic module assembly, according to another embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an apparatus having one or more photovoltaic devices disposed on a flexible supporting material. Embodiments of the present disclosure may also relate to an apparatus and method of forming a photovoltaic module assembly that includes a plurality of photovoltaic modules and a flexible supporting material that has one or more integrated conductive elements disposed therein that is used to interconnect the plurality of photovoltaic modules.

Figure 1A:
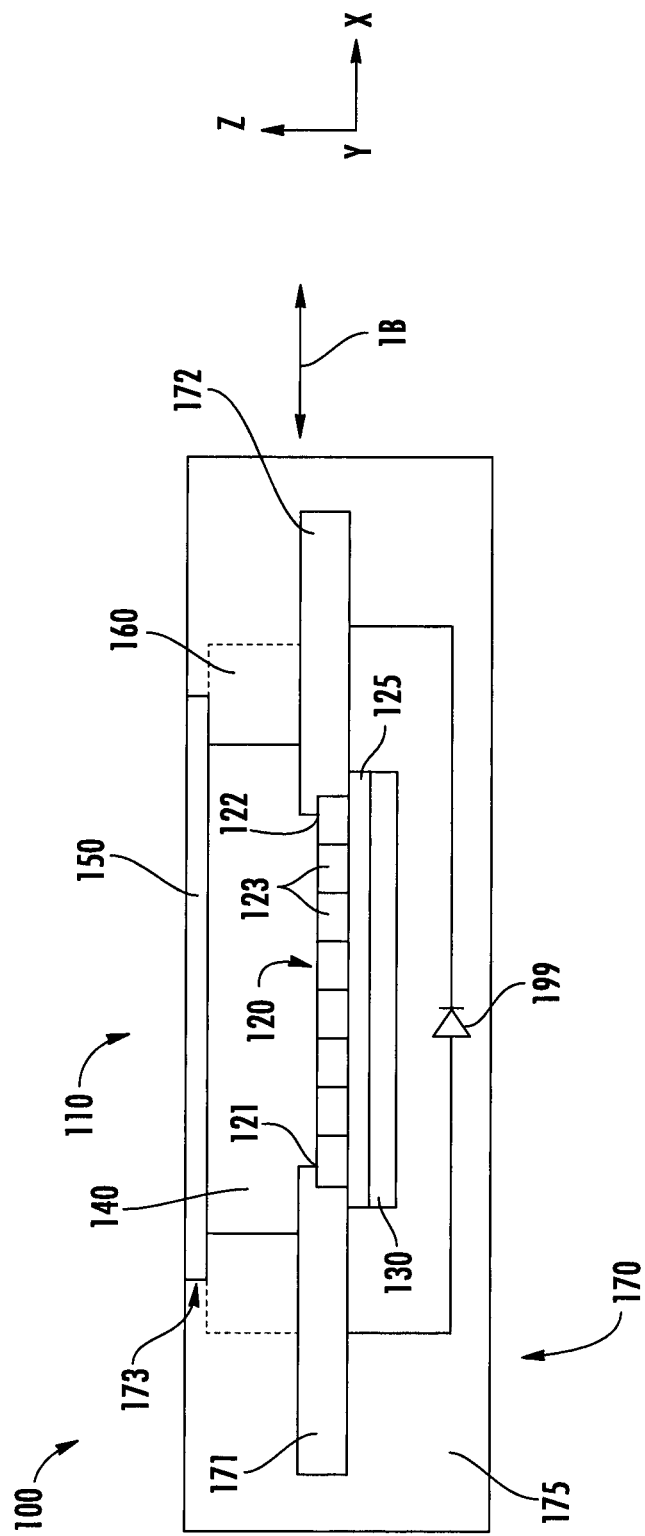
FIG. 1A is a cross sectional view of a flexible photovoltaic module assembly, according to one embodiment.
Figure 1B:
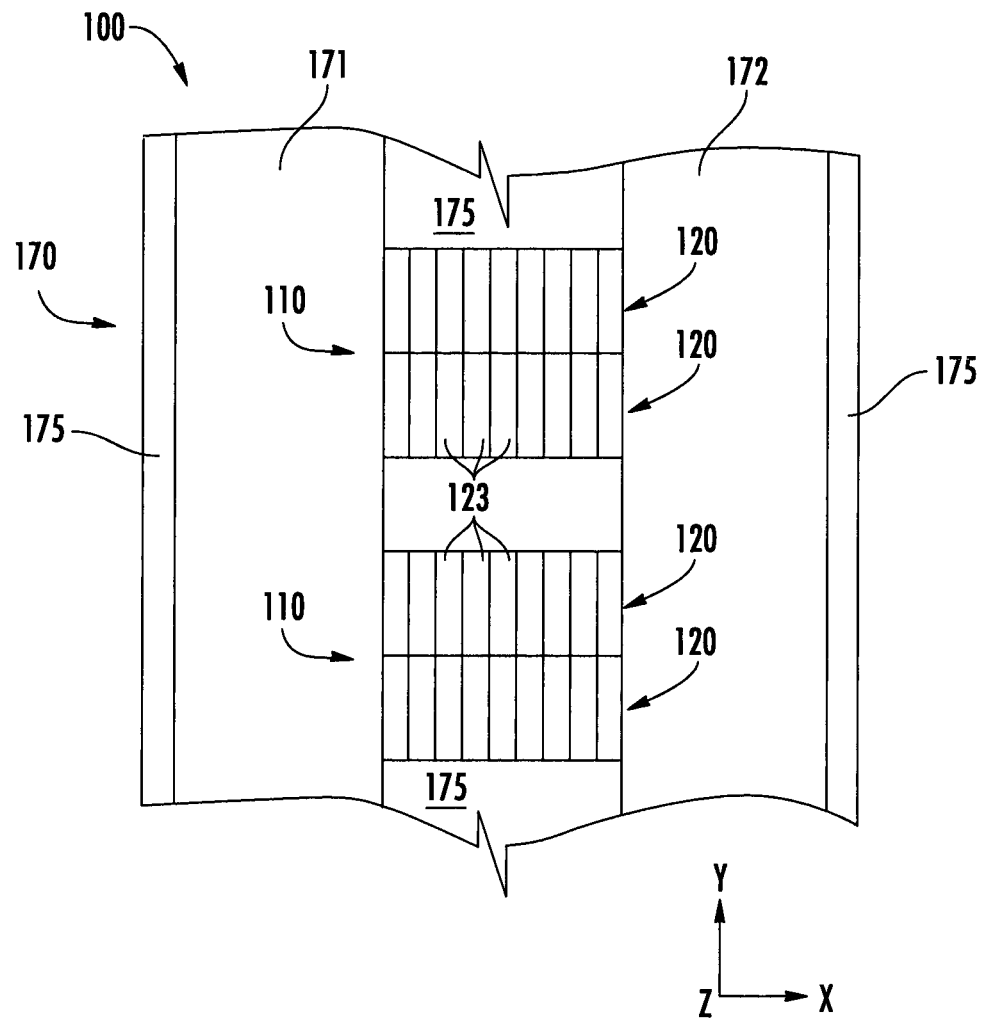
FIG. 1B is a top view of the photovoltaic module assembly of FIG. 1A, taken at a level in the Z-direction of the line 1B in FIG. 1A.

FIG. 1A is a cross sectional view of a flexible photovoltaic module assembly 100 (flexible photovoltaic apparatus), according to one embodiment of the disclosure provided herein. FIG. 1B is a top view of the photovoltaic module assembly 100 taken at a level in the Z-direction of the line 1B in FIG. 1A. The photovoltaic module assembly 100 may include multiple optoelectronic devices, such as photovoltaic devices (e.g., solar cells), diodes, and LEDs. The view in FIG. 1B of the photovoltaic module assembly 100 is shown including two photovoltaic modules 110, although more photovoltaic modules 110 may be included as the photovoltaic module assembly 100 extends in the Y-direction (second direction). Each photovoltaic module 110 will generally include two or more photovoltaic sub-modules 120 (photovoltaic device), although fewer photovoltaic sub-modules 120 may be included in some configurations.

The photovoltaic modules 110 can be disposed on or within a fabric 170 (first fabric). Although the following generally describes photovoltaic modules being disposed on fabrics, other flexible supporting materials may be used, such as sheets, films, membranes, or composites (e.g., composites including glass fibers). The fabric 170 serves as the supporting material for the photovoltaic modules 110, and typically also provides one or more of the electrical connections to the photovoltaic modules 110. For example, the fabric 170 includes a first conductive fabric 171 (first conductor) and a second conductive fabric 172 (second conductor) that are electrically connected to opposing ends 121, 122 of each photovoltaic sub-module 120. In some embodiments, the conductive elements in the first conductive fabric 171 and the second conductive fabric 172 are directly electrically connected to conductive regions formed at the opposing ends 121, 122 of each photovoltaic sub-module 120, and thus remove the need for traditional busbars disposed at each of the opposing ends 121, 122. The conductive fabrics 171, 172 are typically disposed within layers of insulating materials, which is referred to herein as an insulating fabric 175.

FIGS. 1C-1G illustrate examples of configurations of a fabric 170 that may be used in the photovoltaic module assembly 100. FIG. 1C is an isometric view of a portion of a fiber containing version of the fabric 170. FIG. 1D is a side view that is aligned with a conductive fiber 171A in a portion of the fabric 170 shown in FIG. 1C. In general, the fabric 170 may contain a top insulating layer 175A, a conductive fabric 171 and a bottom insulating layer 175B. The conductive fabric 171 may include a plurality of conductive elements, such as conductive fibers 171A, and a plurality of electrically insulating fibers 171B that are bonded and/or woven together. The conductive fibers 171A include conductive current carrying elements, such as metal wires (e.g., wires containing copper, silver, tin, lead, gold, and/or aluminum), conductive yarns or other flexible conductive materials (e.g., graphite fibers). In some embodiments, the conductive fibers 171A include a non-conductive fabric that is coated with a conductive material (e.g., a non-conductive fabric coated with a metal, such as aluminum, silver or copper). The non-conductive material used to form these coated conductive fabrics can include fabrics formed of, for example, ethylene tetrafluoroethylene (ETFE), polytetrafluoroethylene (PTFE), polyvinyl chloride (PVC), thermoplastic olefins (TPO), or composites (e.g., composites with glass fibers). One or more of the conductive fibers 171A in the conductive fabric 171 may be aligned or oriented in one or more directions (e.g., X and/or Y-directions) within the conductive fabric 171 to interconnect one or more of the electrical components (e.g., photovoltaic modules 110) within the photovoltaic module assembly 100. Referring to FIG. 1C, in some configurations, two or more conductive fibers 171A may be oriented such that they can conduct electricity in a first direction (X-direction) and the insulating fibers 171B, which are used to support the conductive fibers 171A, may be positioned (e.g., woven together) such that they extend in the first direction and/or a second direction (Y-direction). The top insulating layer 175A and the bottom insulating layer 175B may include a non-porous insulating sheet, polymer impregnated insulating woven fabric or other insulating material that can physically isolate the conductive elements in the conductive fabric 171, 172 from the external environment outside of the fabric 170. In some examples, the top insulating layer 175A and the bottom insulating layer 175B comprise a polymer material or insulating fiber material, such as a material that may include ETFE, ECTFE, PTFE, PVC, TPO, glass, Nylon, or epoxy.

FIG. 1E is an isometric view of a portion of an alternate type of fabric 170. FIGS. 1F and 1G are side views of two different examples of the fabric 170 illustrated in FIG. 1E. In these examples, the portion of the fabric 170 includes the top insulating layer 175A, the conductive fabric 171 and the bottom insulating layer 175B. However, in one configuration, as shown in FIG. 1F, the conductive fabric 171 may include a conductive material containing layer (e.g., conductive layer 171C) that at least partially extends in a first direction (e.g., X-direction) and/or a second direction (e.g., Y-direction). In one example, the conductive layer 171C within the conductive fabric 171 includes a flexible metal foil or flexible conductive sheet that is configured to transfer current between two or more photovoltaic modules 110. In some configurations, the conductive layer 171C is a metal containing layer that is patterned to form separate conductive regions that are electrically isolated from each other and are aligned or oriented so as to transfer current between the various electrical components (e.g., photovoltaic modules 110) within the photovoltaic module assembly 100. In one configuration, as shown in FIG. 1G, one of the insulating layers, such as the bottom insulating layer 175B further includes a reinforcement layer 175C. The reinforcement layer 175C may include a fiber containing textile, woven fabric or other reinforcing material that is adapted to provide mechanical support to fabric 170.

Therefore, by aligning and configuring the one or more conductive elements within the conductive fabrics 171, 172 of the fabric 170, various photovoltaic module interconnection configurations can be achieved. Referring to FIG. 1B, in some embodiments, the conductive fabric 171 includes conductive elements (e.g., conductive fibers 171A, conductive layers 171C) that are configured to conduct electricity in at least the +Y and −Y-directions to interconnect the opposing ends 121 of two or more photovoltaic modules 110, and the conductive fabric 172 includes conductive elements that are configured to conduct electricity in at least the +Y and −Y-directions to interconnect the opposing ends 122 of the two or more photovoltaic modules 110. Examples of other interconnection configurations are further discussed below. While FIG. 1B illustrates the photovoltaic modules 110 being electrically connected in parallel using the conductive fabrics 171, 172, in some embodiments the photovoltaic modules 110 may be electrically connected in series.

In other embodiments, one or more conductors may be disposed onto one or more fabrics. FIG. 1H is a side view of a fabric 170h that may be disposed within a flexible photovoltaic module assembly, according to one embodiment. The fabric 170h includes the bottom insulating layer 175B, which can be an insulating fiber material as described above. In this embodiment, conductors 178 can be placed directly onto the bottom insulating layer 175B. The conductors 178 can be placed onto the bottom insulating layer 175B in a desired pattern and orientation so as to interconnect two or more photovoltaic modules. In one example, the conductors 178 are configured to conduct electricity in at least the +Y and −Y-directions to interconnect two or more photovoltaic modules 110 that are disposed in an array that extends in the Y-direction. In one embodiment, the conductors 178 can be placed onto the bottom insulating layer 175B using methods, such as sputtering or screen printing a conductive material, such as a metal (e.g., copper, silver, tin, aluminum), or depositing an organic conductor onto a surface of the bottom insulating layer. In another embodiment, the conductors 178 can be placed onto the bottom insulating layer 175B by laminating or bonding a conductive strip, sheet or wire thereon, such as a metal containing strip (e.g., copper, silver, tin, or aluminum containing strip). The electrically separated conductors 178 can be used to make electrical connections (e.g., connections of opposite polarity) to the photovoltaic sub-modules (not shown). Although not shown, in some embodiments, at least a portion of the top insulating layer 175A can be placed over the bottom insulating layer 175B after the conductors 178 are placed onto the bottom insulating layer 175B.

FIG. 1I is a partial top view of a fabric 170i that may be disposed within a flexible photovoltaic module assembly, according to one embodiment. The fabric 170i is similar to the fabric 170h described above except that the fabric 170i has conductors 178 that extend in two dimensions across a surface of the bottom insulating layer 175B to form a mesh 178M of conductors 178. The conductors 178 shown in the mesh 178M on the bottom insulating layer 175B of the fabric 170i can be used to make electrical connections to photovoltaic modules (not shown) that are disposed in an array that extends in the X and/or Y-directions. Electrically separated meshes 178M can be used to make electrical connections (e.g., connections of opposite polarity) to the photovoltaic sub-modules (not shown). The mesh 178M can be formed using the same methods described above for the conductors 178 in reference to FIG. 1H.

FIG. 1J is a partial side view of a fabric 170j that may be disposed within a flexible photovoltaic module assembly, according to one embodiment. The fabric 170j includes the bottom insulating layer 175B, which can be an insulating fiber material as described above. In this embodiment, conductive threads 177 can be partially or fully (i.e., fully surrounded by insulating fabric) disposed within the bottom insulating layer 175B. In other embodiments, the conductive threads 177 can be disposed on the insulating layer 175B. For example, the conductive threads 177 can be placed on the insulating layer 175 and then an adhesive or a lamination process can be used to secure the conductive threads 177 to the insulating layer 175B. The electrically separated and oriented regions that contain the conductive threads 177 can be used to make electrical connections (e.g., connections of opposite polarity) to the photovoltaic sub-modules (not shown). In one example, the regions that contain the conductive threads 177 are configured to conduct electricity in at least the +Y and −Y-directions to interconnect two or more photovoltaic modules 110, which are disposed in an array that extends in the Y-direction. Although not shown, in some embodiments, the top insulating layer 175A can be placed over the bottom insulating layer 175B after the conductive threads 177 are placed onto or disposed within the bottom insulating layer 175B. The conductive threads 177 can be formed of a conductive material, such as a metal containing yarn, wires or other flexible conductive materials as similarly discussed herein.

FIG. 1K is a partial side view of a fabric 170k that may be disposed within a flexible photovoltaic module assembly, according to one embodiment. The fabric 170k includes the bottom insulating layer 175B and the top insulating layer 175A, which can be an insulating fiber material as described above. In this embodiment, a conductive layer 176 is disposed between the insulating layers 175A, 175B. The conductive layer 176 can be formed of one of the conductive materials described above, including but not limited to the conductors 178, the conductive mesh 178M, or the conductive threads 177. Electrically separated conductive layers 176 can be used to make electrical connections (e.g., connections of opposite polarity) to the photovoltaic sub-modules (not shown).

FIG. 1L is a partial side view of a fabric 170L that may be disposed within a flexible photovoltaic module assembly, according to one embodiment. The fabric 170L includes the bottom insulating layer 175B and the top insulating layer 175A, which can be an insulating fiber material as described above. The fabric 170L further includes an additional middle insulating layer 175M that may be formed of the same materials as the insulating layers 175A, 175B described above. The additional middle insulating layer 175M may be disposed between the bottom insulating layer 175A and the top insulating layer 175A. In this embodiment, a conductive layer 176 is disposed between the insulating layers 175A and 175M and also between insulating layers 175B and 175M. The conductive layer 176 can be formed of one of the conductive materials described above, including but not limited to the conductors 178, the conductive mesh 178M, or the conductive threads 177. In some embodiments, the conductive layers 176 shown in FIG. 1L can be electrically separated conductive layers 176 that can be used to make electrical connections (e.g., connections of opposite polarity) to the photovoltaic sub-modules (not shown). Other embodiments of fabrics that may be used within a flexible photovoltaic module assembly may include more than two conductive layers 176 that are spaced apart in the Z-direction by an insulating layer.

Figure 1M:
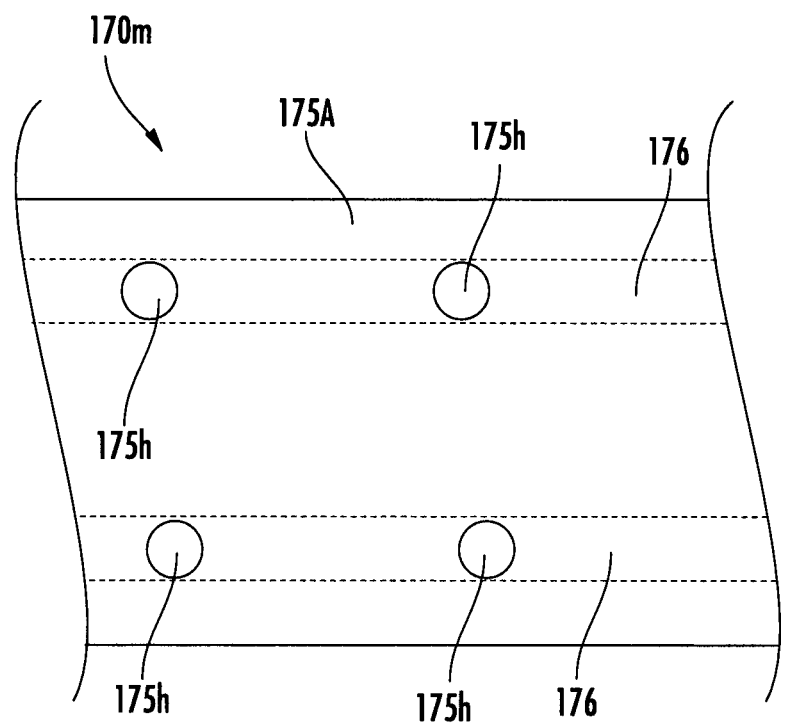
FIG. 1M is a top view of a fabric 170 that may be disposed within a flexible photovoltaic module assembly, according to one embodiment.

FIG. 1M is a top view of a fabric 170*m* that may be disposed within a flexible photovoltaic module assembly, according to one embodiment. The fabric 175*m* includes a pair of conductive layers 176 spaced apart in the Y-direction. The conductive layers 176 are shown with dashed lines to indicate that the conductive layers 176 are hidden beneath the top insulating layer 175A. The fabric 170*m* includes a modified top insulating layer 175A that includes a plurality of holes 175*h*. The plurality of holes 175*h* can be used to enable electrical connections (e.g., connections of opposite polarity) to be formed between specific connection points on the photovoltaic modules (not shown) and a portion of the conductive layer 176. For example, photovoltaic modules, having conductive pins or other conductors disposed thereon, can be placed on the fabric 170*m*, so that the conductive pins are aligned with the holes 175*h*, and thus the conductive pins can make electrical contact with a desired portion of a conductive layer 176. In some embodiments, the pattern of the holes 175*h* that are formed in the insulating layer can be configured to match a specific pattern of the connecting pins disposed on each photovoltaic module. Thus, by the selection of a desirable hole pattern in the insulating layer the positional alignment of a photovoltaic module can be set such that it prevents improper installation of the photovoltaic module on the fabric and properly aligns the photovoltaic module within the photovoltaic module assembly.

In some embodiments, each photovoltaic sub-module 120 is formed on a substrate 125. The substrate 125 may be a flexible substrate, a rigid substrate, or semi-rigid material containing substrate (i.e., semi-rigid substrates distort under their own weight, but are unable to be wound into a roll), and is typically formed from an electrically insulating material. For example, in one embodiment a polyimide substrate may be used for the substrate 125.

In some embodiments, each photovoltaic sub-module 120 within each photovoltaic module 110 may include a plurality of thin-film layers that are deposited on the substrate 125, and then patterned (e.g., scribed) to form a plurality of monolithically interconnected photovoltaic cells 123 that are electrically connected in series in an array. The array extends in the X-direction (first direction) from a first end 121 of the photovoltaic sub-module 120 to a second end 122 of the photovoltaic sub-module 120. In other embodiments, the photovoltaic sub-modules 120 can include a photovoltaic device formed on another substrate that is then positioned on the substrate 125.

Each photovoltaic sub-module 120 can be formed of, for example, a back-contact layer (not shown) formed on the substrate 125, an absorber layer (not shown) formed over the back-contact layer, and a front-contact layer (not shown) formed over the absorber layer. The back-contact layer can be fabricated from a material having a high optical reflectance and is commonly made of molybdenum (Mo) although several other thin-film materials, such as metal chalcogenides, molybdenum chalcogenides, molybdenum selenides (such as MoSe2), sodium (Na)-doped Mo, potassium (K)-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, titanium (Ti), tungsten (W), tantalum (Ta), gold (Au), silver (Ag), copper (Cu), and niobium (Nb) may also be used or included advantageously. In some embodiments, the back-contact layer is deposited onto the substrate 125 by use of sputtering process.

The absorber layer is typically made of an "ABC" material, wherein "A" represents elements in group 11 of the periodic table of chemical elements as defined by the International Union of Pure and Applied Chemistry including copper (Cu) or silver (Ag), "B" represents elements in group 13 of the periodic table including indium (In), gallium (Ga), or aluminum (Al), and "C" represents elements in group 16 of the periodic table including sulfur (S), selenium (Se) or tellurium (Te). An example of an ABC material is the Cu(In,Ga)Se2 semiconductor also known as CIGS. In some embodiments, the absorber layer may be a polycrystalline material. In other embodiments, the absorber layer may be a monocrystalline material. Another example of a material that may be used as the absorber layer is chalcopyrite.

The front-contact layer can be an electrically conductive and optically transparent material, such as a transparent conductive oxide (TCO) layer. For example, in some embodiments, the front-contact layer may be formed of doped or non-doped variations of materials, such as indium oxides, tin oxides, or zinc oxides.

In some embodiments, a semiconductive buffer layer can be disposed between the absorber layer and the front-contact layer. The semiconductive buffer layer ordinarily has an energy bandgap higher than 1.5 eV. The semiconductive buffer layer may be formed of materials, such as CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

Each photovoltaic module 110 may be encapsulated within the photovoltaic module assembly 100 by use of a front-side adhesive 140 and a back-side adhesive 130. In some embodiments, the front-side adhesive 140 and the back-side adhesive 130 completely surround and encapsulate the photovoltaic sub-modules 120. The front-side adhesive 140 can be formed over the front-contact layer of each of the photovoltaic sub-modules 120, and also over portions of the conductive fabrics 171, 172 (described in greater detail below) that make electrical connections to the photovoltaic sub-modules 120. The front-side adhesive 140 may be formed of a flexible material, such as a flexible polymer. For example, in one embodiment the front-side adhesive 140 may be formed of a thermoplastic olefin (TPO) based polymer or a TPO blend.

The back-side adhesive 130 is disposed over the side of the substrate 125 that is opposite to the side that the photovoltaic sub-module 120 is formed. The back-side adhesive 130 may be formed of a flexible material, such as a flexible polymer. For example, in one embodiment the back-side adhesive 130 may be formed of a thermoplastic olefin-based polymer (TPO) or a TPO polymer blend. The back-side adhesive 130 may also be disposed on, over or around portions of the conductive fabrics 171, 172 (described in greater detail below). The back-side adhesive 130 may contact the front-side adhesive 140 at one or more locations, such as edges 111 of the photovoltaic modules 110 in the Y-direction, so that the front-side adhesive 240 and the back-side adhesive 230 can protect these areas of the photovoltaic modules 110 from the external environment.

A front sheet 150 can be disposed on an outer surface of the front-side adhesive 140, such as a top surface of the front-side adhesive 140. The front sheet 150 can be formed of a transparent material, such as glass or a transparent thermoplastic polymer. The front sheet 150 may be formed of an optically transparent flexible material.

In some embodiments, each photovoltaic module 110 can further include an optional edge seal 160 (FIG. 1A) disposed around the edges of each photovoltaic sub-module 120. The presence of the edge seal 160 at the edge of the photovoltaic module assembly 100 can help assure that photovoltaic module assembly 100 can eliminate common photovoltaic apparatus manufacturing and photovoltaic device failure modes by preventing moisture and other substances from reaching the photovoltaic sub-modules 120. In some embodiments, the edge seal 160 can be formed over the outer surface of the front sheet 150 as well to provide an even stronger seal against the external environment. In general, the edge seal 160 comprises a polymeric material, such as an elastomer, for example a butyl rubber.

As noted above, the first conductive fabric 171 is connected to the first end 121 of the photovoltaic sub-module 120, and the second conductive fabric 172 is connected to the second end 122 of the photovoltaic sub-module 120. In some embodiments, the conductive fabrics 171, 172 can have conductive elements that are formed of a copper or silver containing material that are electrically connected to the ends 121, 122 of the photovoltaic sub-modules 120, respectively. A conductive adhesive or solder can be used to attach the conductive elements of the conductive fabric 171, 172 to the ends 121, 122 of the photovoltaic sub-modules 120. Although the conductive fabrics are shown as contacting the top side (i.e., the side facing the sun during use) of the photovoltaic sub-module 120, in other embodiments one or both of the conductive fabrics 171, 172 may contact conductive portions of the photovoltaic sub-module 120 formed on the bottom side (i.e., the side facing away from the sun during use) of the photovoltaic sub-module 120.

The insulating fabric 175 that at least partially surrounds the conductive fabrics 171, 172 can also be formed of the same or similar materials as the non-conductive material 171B included in the conductive fabrics 171, 172 as well as other materials, such as a textile with a polymeric coating (e.g., coating including silicone, PVC, ECTFE, ETFE, epoxy, urethane, butyl rubber, etc.). The insulating fabric 175 in some cases may include a silicone containing foam material that is flexible. In some embodiments, the conductive elements in the conductive fabrics 171, 172 are woven or stitched into portions of the insulating fabric 175, while in other embodiments the conductive elements in the conductive fabrics can be attached to the insulating fabric using an adhesive or ultrasonic welding. The insulating fabric 175 can electrically isolate electrical components disposed in the fabric 170 and can also serve as a moisture barrier to protect the photovoltaic modules 110. In some embodiments, a portion of the insulating fabric 175 can be laminated and/or bonded directly to the front sheet 150 to form a seal around the photovoltaic modules 110 within the photovoltaic module assembly 100, thus in some cases removing the need for the edge seal 160.

In some embodiments, one or more conductive fibers 171A in the conductive fabric 171 configuration may also be used to join the fabric 170 to the photovoltaic modules 110. In this case, the conductive fibers 171A may be formed in zigzag, straight seam or double straight seam pattern to physically connect portions of the fabric 170 to the photovoltaic modules 110. The conductive fibers 171A may be formed in zigzag, straight seam or double straight seam pattern that is primarily aligned parallel to the X and Z-direction (FIG. 1A). In an alternate configuration, the conductive fibers 171A may be formed in zigzag, straight seam or double straight seam pattern that is aligned parallel to the X-Y plane (FIG. 1A).

Using conductive fabrics 171, 172 within the fabric 170 instead of flat and rigid busbars as the conductors allows electrical connections to be made to the photovoltaic sub-modules 120 without sacrificing the flexibility of the fabric 170. Also, in some embodiments, the conductive fabrics 171, 172 can add to the mechanical strength of the fabric, such as when the conductive fabric has greater tensile strength than the surrounding insulating fabric. The conductive fabrics can also stretch and deform with the insulating fabric in response to mechanical stresses (e.g., high wind exposure) which places less stress on the insulating fabric compared to a photovoltaic assembly using flat and rigid busbars. Furthermore, using conductive fabrics can also reduce damage caused to photovoltaic module assemblies by thermal stress because the weaving paths of the fibers in the conductive fabrics causes the fibers to expand and contract in multiple directions compared to a flat and rigid busbar that primarily expands and contracts along the length of the busbar. In embodiments in which the individual fibers or small sets of fibers of the conductive fabrics are woven into the insulating fabric, the thermal stress of the expanding or contracting conductive fibers on the insulating fabric can be further reduced due to the more distributed arrangement of the conductive fibers throughout the insulating fabric.

Disposing photovoltaic modules 110 on flexible materials, such as fabrics, allows the photovoltaic module assembly 100 to be easily placed on surfaces, such as roofs, building facades or walls, or to span supporting structures to form structures, such as roofs, walls, or shading structures. Placing the photovoltaic modules 110 on fabrics also reduces the weight of the photovoltaic module assembly 100 relative to other heavier supporting materials. Moreover, the ease at which fabrics can be placed into a roll simplifies transport and storage of the photovoltaic module assembly 100.

The photovoltaic module assembly 100 can be formed by using a roll-to-roll process that includes placing the photovoltaic modules 110 in or on the fabric 170. For example, to form the fabric 170, the material that forms the conductive fabrics 171, 172 can be placed onto a layer of the insulating fabric 175 (e.g., bottom insulating layer 175B), and then an additional layer of insulating fabric 175 (e.g., top insulating layer 175A) can be placed over the conductive material. One or more adhesives may be used to secure the conductive material to the insulating material.

Figure 1N:
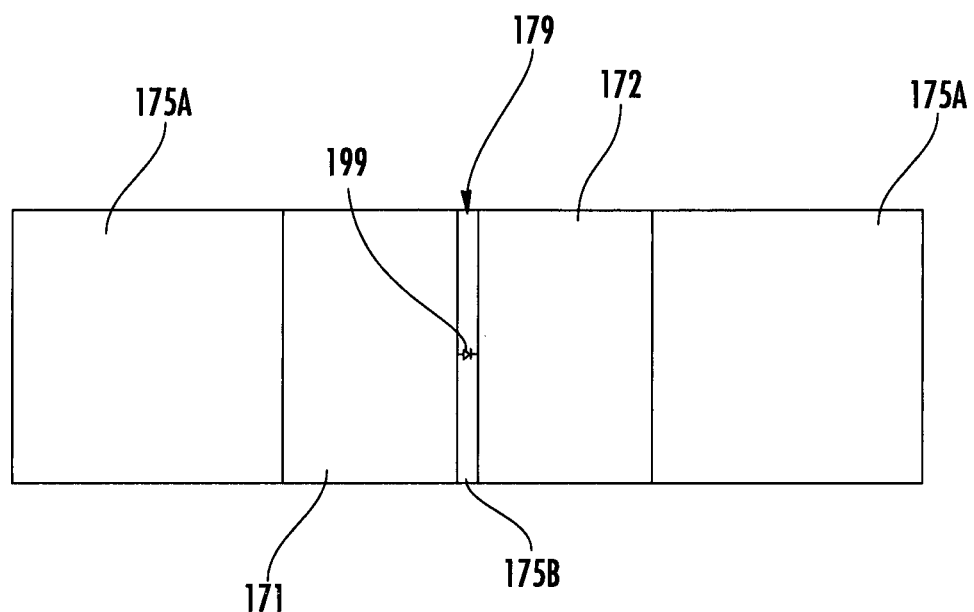
FIG. 1N is a plan view of a portion of a conductive fabric sheet that has been sectioned to form two electrically isolated conductive fabrics, according to one embodiment.
Figure 1O:
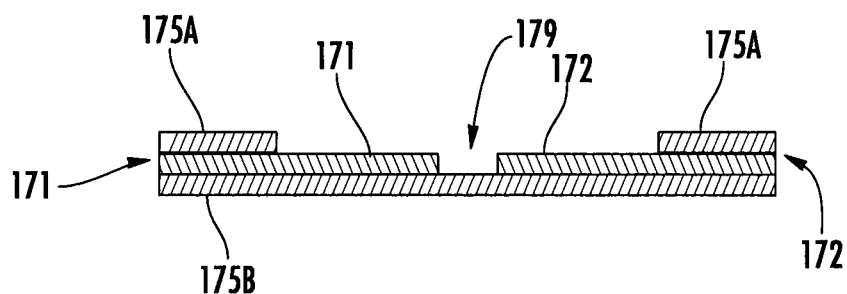
FIG. 1O is a side cross-sectional view of the portion of the conductive fabric sheet illustrated in FIG. 1N, according to one embodiment.

In some embodiments, portions of the conductive material (e.g., conductive layer 171C in FIGS. 1E-1G) are removed before adding the second insulating layer to form the separate conductive fabrics, such as the conductive fabrics 171, 172. For example, in one embodiment, a laser scribing process can be used to form the conductive fabrics 171, 172, as shown in FIGS. 1N-1O. FIG. 1N is a plan view of a formed conductive fabric sheet that has been partially sectioned to form the conductive fabrics 171, 172. In this example, the conductive fabrics 171, 172 are formed by removing a portion of a conductive layer 171C, such as by forming a groove 179 in the conductive layer 171C, to electrically separate the conductive regions of the conductive fabrics 171, 172. FIG. 1O is a side view of the portion of the partially sectioned portion of the conductive fabric sheet shown in FIG. 1N.

During manufacturing, a photovoltaic module 110 can be added to a photovoltaic module assembly 100, by positioning it in a recess 173 (FIG. 1A) formed in the fabric 170, and then the photovoltaic module 110 can be placed in the recess 173. Next, the adhesives, such as the back-side adhesive 130, can be used to secure the photovoltaic module 110 to the fabric 170 disposed in the recess 173. In some embodiments, a lamination process is used to assist in adhering the photovoltaic modules 110 to the fabric 170. The lamination process can also assist in adhering the insulating fabric 175 to the conductive fabrics 171, 172 and/or the adhesive layers (e.g., back-side adhesive 130). In some embodiments, the insulating fabric 175 (e.g., ETFE) can be joined to the conductive fabrics 171, 172 using other techniques, such as ultrasonic welding. In some embodiments, the photovoltaic module assembly 100 can be combined with one or more other photovoltaic module assemblies 100 using techniques, such as sewing or ultrasonic welding to create larger photovoltaic arrays that contain a plurality of photovoltaic modules 110 On the outer surfaces of the photovoltaic module assembly 100, such as surfaces of the insulating fabric 175, one or more logos, text or other graphics may be added.

The photovoltaic module assembly 100 may further include one or more bypass diodes 199, such as flattened bypass diodes, that are designed to prevent the effects of hot-spot heating. For example, in some embodiments, each photovoltaic module 110 or each photovoltaic sub-module 120 can include a bypass diode 199. The bypass diode 199 can be integrated within the fabric 170 of the photovoltaic module assembly 100 during manufacturing and is connected in parallel, but with an opposite polarity to the sub-modules 120 as shown in FIG. 1A. In some configurations, the leads of a bypass diode 199 are electrically connected to the first and second conductive fabrics 171, 172 by use of a bonding technique, such as a soldering technique. In one example, a bypass diode 199 can be disposed between the conductive fabrics that are formed from a conductive fabric sheet, as illustrated in FIG. 1N. In some embodiments, additional electronics can be incorporated into the fabric 170, such as switches, additional diodes, light-emitting diodes, resistors, power optimizers, micro-inverters, or other power electronics. In some embodiments, these additional electronics can be disposed on a structure similar to a printed circuit board within the fabric 170.

Figure 1P:
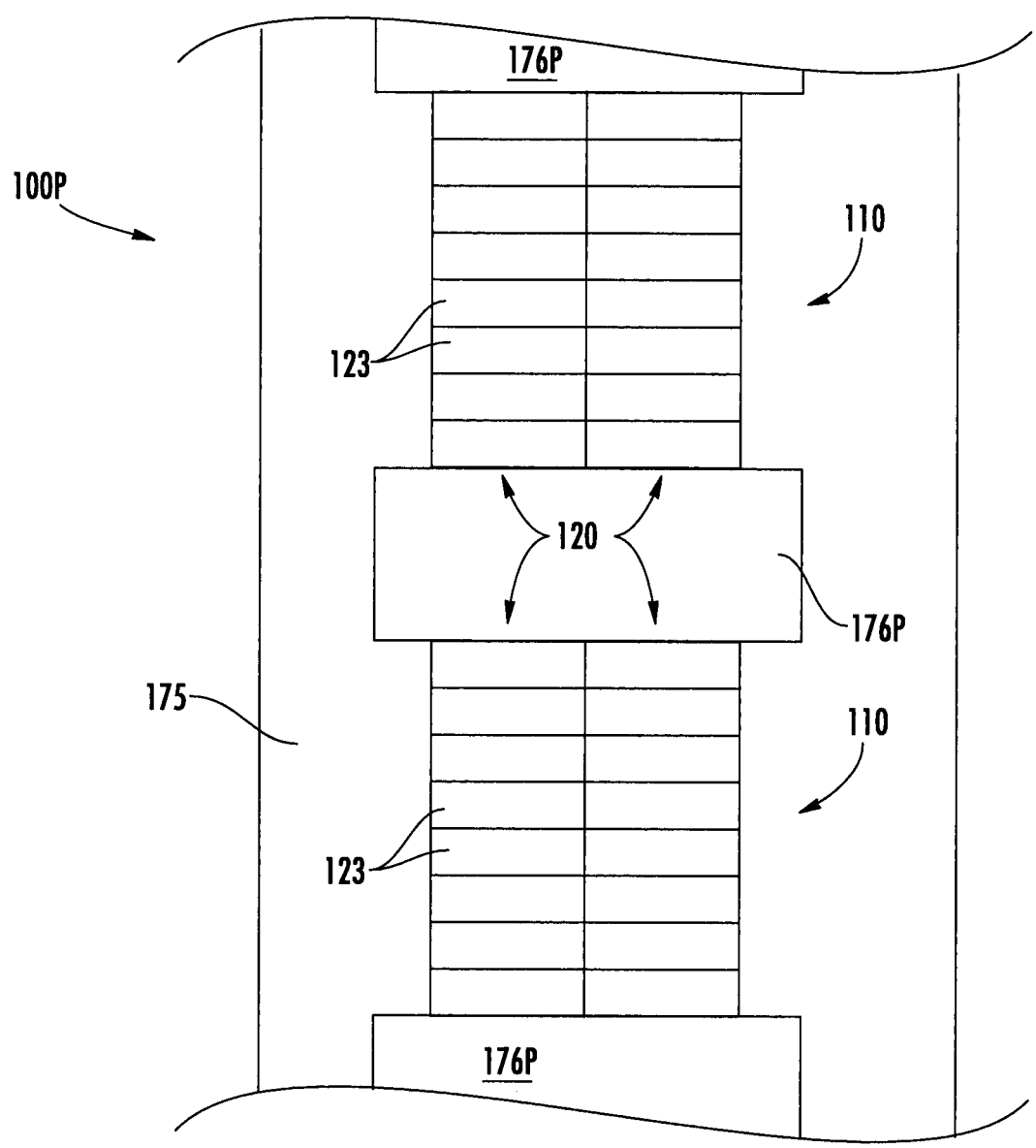
FIG. 1P is a top view of a photovoltaic module assembly, according to one embodiment.

FIG. 1P is a top view of a photovoltaic module assembly 100P, according to one embodiment. The photovoltaic module assembly 100P is similar to the photovoltaic module assembly 100 described above in reference to FIG. 1B except that the photovoltaic modules 110 in the photovoltaic module assembly 100P are electrically connected to each other in series and are rotated 90 degrees relative to the photovoltaic modules 110 in the photovoltaic module assembly 100. In this embodiment, a fabric 170 may include a conductive fabric that has a single conductive element 176P that extends in the Y-direction between the opposing terminals of adjacent photovoltaic modules 110 to make the series connection. In some embodiments, the photovoltaic module assemblies, such as photovoltaic module assembly 100P, include photovoltaic modules connected in series extend for lengths up 20 meters and generate high output voltages, such as on the order of 1 kilovolt (kV).

Figure 2A:
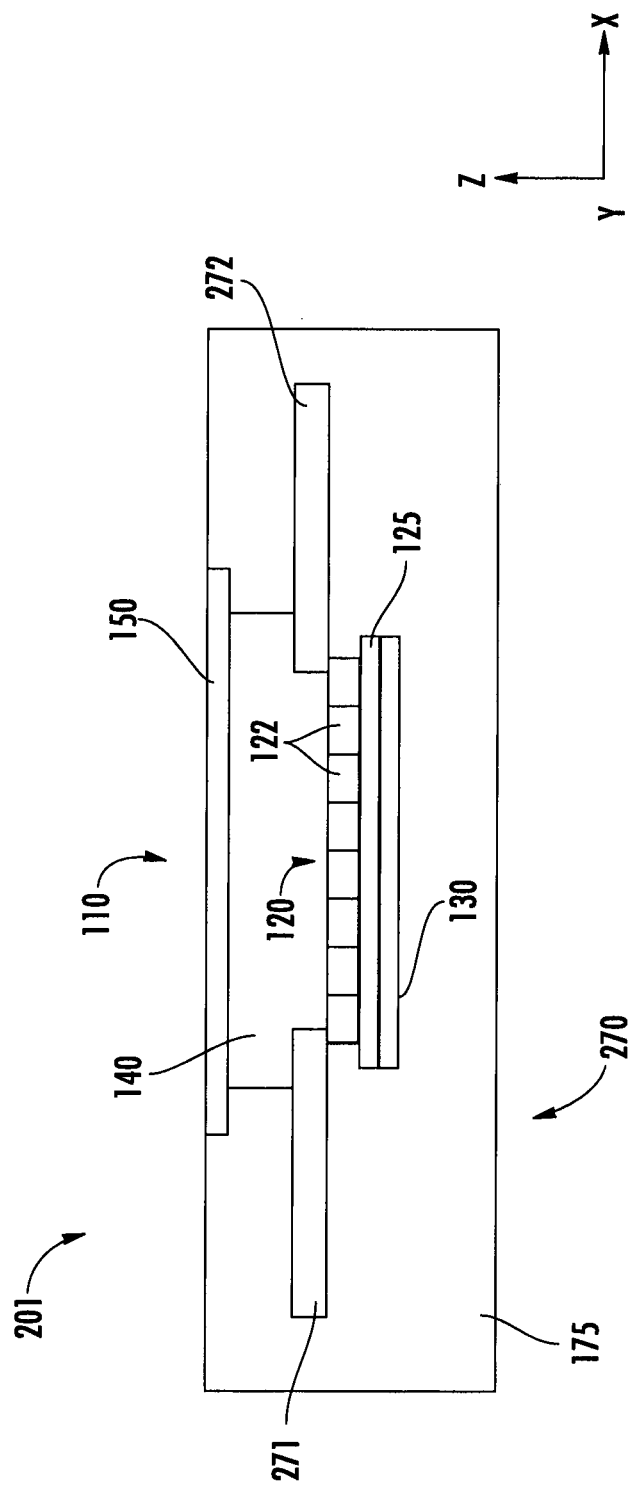
FIG. 2A is a cross sectional view of a flexible photovoltaic module assembly, according to another embodiment.

FIG. 2A is a cross sectional view of a flexible photovoltaic module assembly 201, according to another embodiment. The photovoltaic module assembly 201 is similar to the photovoltaic module assembly 100 described above except that the photovoltaic module assembly 201 includes a fabric 270 having a first conductive layer 271 and a second conductive layer 272 instead of the fabric 170 that includes the first conductive fabric 171 and the second conductive fabric 172. The conductive layers 271, 272 can be formed of materials other than fabrics, such as flexible solid conductive sheets (e.g., metal foils). The conductive layers 271, 272 can act as a barrier foil for the photovoltaic module assembly 201. In some embodiments, additional photovoltaic modules 110 can be spaced apart from the photovoltaic module 110 shown in FIG. 2A in both the X-direction and the Y-direction. The photovoltaic modules 110 spaced apart from each other in the Y-direction can be electrically isolated from each other by removing portions of the conductive layers 271, 272, for example by laser scribing the conductive layers, after placing the conductive layers on the insulating fabric 175. In some cases, the conductive layers 271, 272 may be formed using a process similar to the one discussed in conjunction with FIGS. 1N-1O.

Figure 2B:
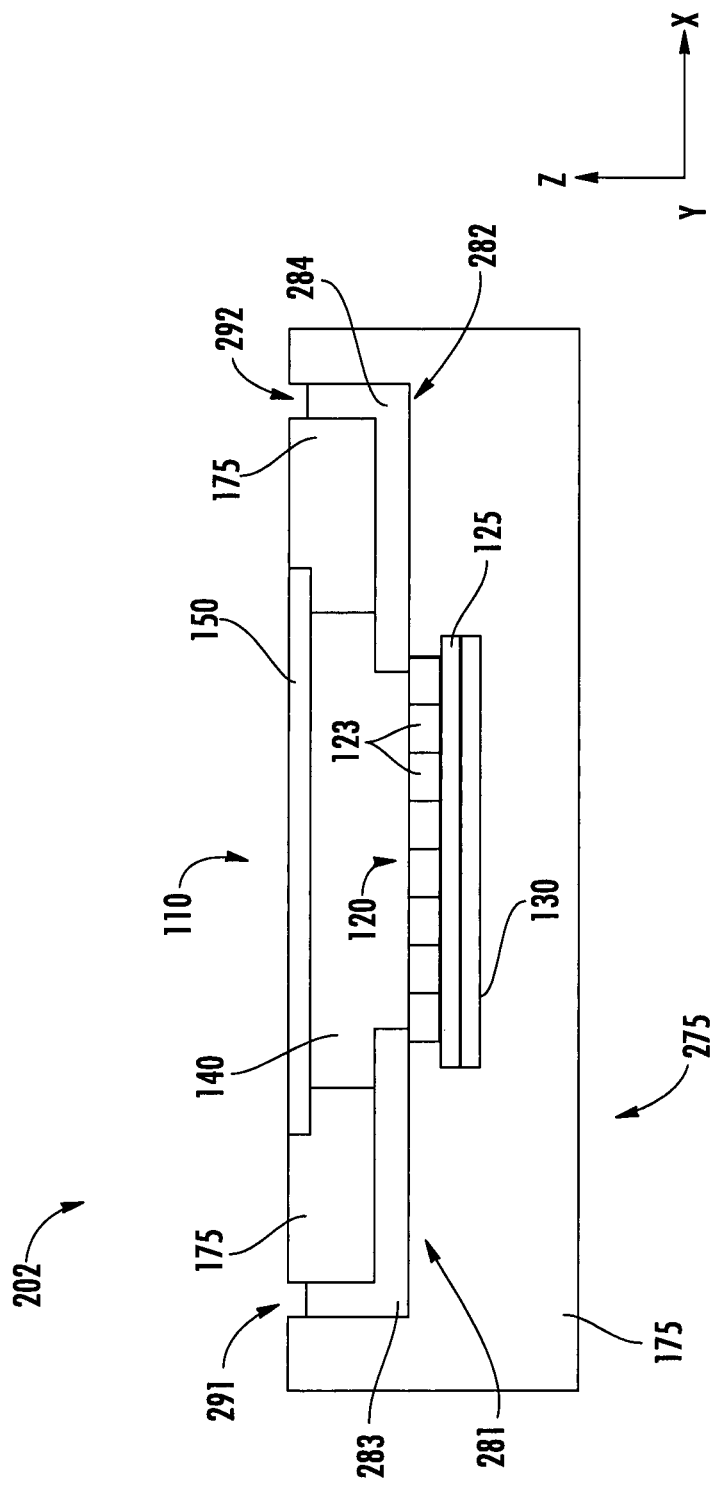
FIG. 2B is a cross sectional view of a flexible photovoltaic module assembly, according to another embodiment.

FIG. 2B is a cross sectional view of a flexible photovoltaic module assembly 202, according to another embodiment. The photovoltaic module assembly 202 is similar to the photovoltaic module assembly 201 described above except that the photovoltaic module assembly 202 includes a fabric 275 having a pair of channels 291, 292 to expose surfaces of respective conductive layers in the photovoltaic assembly 202. The photovoltaic module assembly 202 includes a first conductive layer 281 that has a portion 283 that extends to the channel 291. Similarly, the photovoltaic module assembly 202 includes a second conductive layer 282 that has a portion 284 that extends to the channel 292. The first channel 291 can extend in the Y-direction substantially perpendicular to the X-direction. The channels 291, 292 facilitate making electrical connections to the conductive layers 281, 282. The channels 291, 292 can be spaced apart from the photovoltaic sub-modules 120 by enough of a distance so that any moisture or humidity present at the channels will not reach the photovoltaic sub-modules 120. In some applications, the channels 291, 292 can be used to make external electrical connections to the conductive layers 281, 282, such as connecting the conductive layers 281, 282 to a charge controller or other electronics for charging one or more power sources (e.g., a battery bank).

In other applications, the channels 291, 292 can be used to connect the conductive layers 281, 282 to other photovoltaic module assemblies to form a larger array of photovoltaic modules 110, such as an array that extends in the X and Y-directions. The other photovoltaic module assemblies (not shown) that can connect to the photovoltaic module assembly 202 can have outer portions with protruding conductors (e.g., conductors extending downward) designed to overlap the top surface of the photovoltaic module assembly 202, so that the protruding conductors can fit into the channels 291, 292 and make electrical contact with the conductive layers 281, 282. Although the channels 291, 292 are shown at the top surface of the insulating fabric, in other embodiments the similar channels may be formed at other locations on the photovoltaic module assembly, such as at the bottom surface of the insulating fabric 175 or at one or more of the side surfaces of the insulating channel. Furthermore, in some embodiments, the channels 291, 292 can extend for substantially all of the length of the photovoltaic module assembly 202 in the Y-direction, such as at least 75% of the length of the photovoltaic module assembly 202 in the Y-direction.

Figure 3A:
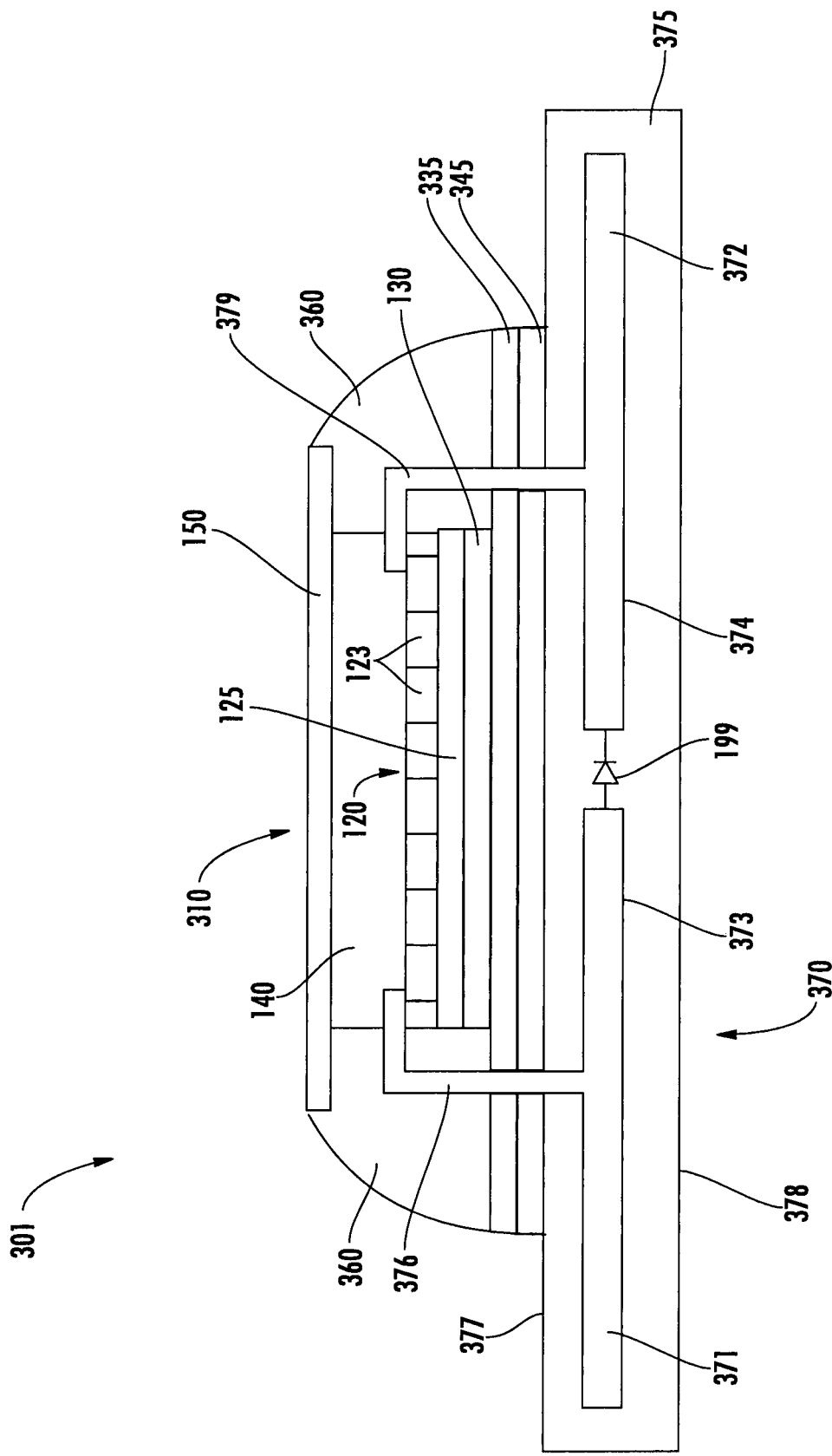
FIG. 3A is a cross sectional view of a flexible photovoltaic module assembly, according to another embodiment.

FIG. 3A is a cross sectional view of a flexible photovoltaic module assembly 301, according to another embodiment. The photovoltaic module assembly 301 is similar to the photovoltaic module assembly 100 described above except that the photovoltaic module assembly 301 includes photovoltaic modules 310 disposed on a fabric 370 instead of within a fabric, or between two portions of fabric, such as how the photovoltaic modules 110 are disposed in the recess 173 of the fabric 170 as shown in FIG. 1A. The photovoltaic module assembly 301 includes a plurality of photovoltaic modules 310 that are disposed on the fabric 370 in a similar arrangement (e.g., modules spaced apart in the Y-direction) to the photovoltaic modules 110 disposed on the fabric 170 shown in FIG. 1B: Each photovoltaic module 310 can similarly include two or more photovoltaic sub-modules 120 similar to the photovoltaic modules 110 described above.

The photovoltaic sub-modules 120 of the photovoltaic modules 310 are disposed on the substrate 125. The front-side adhesive 140 is disposed over the photovoltaic sub-modules 120, and the front sheet 150 is disposed over the front-side adhesive 140. The back-side adhesive 130 in this embodiment is further used to secure the substrate 125 and photovoltaic sub-modules 120 to a back sheet 335. The back sheet 335 can be disposed on an outer surface of the back-side adhesive 130, such as a bottom surface of the back-side adhesive 130. The back sheet 335 may include a reflective material, such as a metal layer, a reflective polymer or a polymer with a reflective layer (e.g., metal foil) formed over a first surface that is adjacent to the bottom surface of the back-side adhesive 130. In some embodiments, the back sheet 335 may be formed from a flexible material (e.g., Flexible polymer layer and/or flexible metal foil). In some embodiments, the back sheet 335 may include a fiber-reinforced polymer material. However, in some embodiments, the back sheet 335 may be formed of a rigid or semi-rigid material. The back sheet 335 is secured to the insulating fabric 375 using an adhesive 345. Although FIG. 3A shows an adhesive 345 being used to secure the photovoltaic module 310 to the fabric 370, in other embodiments other techniques may be used, such as sewing. An edge seal 360 extends from the front sheet 150 to the back sheet 335 to protect the photovoltaic sub-modules 120 from the external environment. The edge seal 360 can be formed of the same materials as the edge seal 160 described above.

The fabric 370 includes a first conductor 371 and a second conductor 372. The first conductor 371 and the second conductor 372 can be formed of a conductive material, such as a metal containing foil, sheet, yarn, wires or other flexible conductive materials as similarly discussed herein. The fabric 370 further includes an insulating fabric 375 that can be formed of the same materials as the insulating fabric 175 described above. The insulating fabric 375 includes a first surface 377 facing the photovoltaic sub-module 120 and a second surface 378 opposite to the first surface 377. The first conductor 371 includes an inner portion 373 extending between two or more photovoltaic cells 123 of the array of the photovoltaic sub-module 120 and the second surface 378 of the insulating fabric 375. The second conductor 371 includes an inner portion 374 extending between two or more photovoltaic cells 123 of the array and the second surface 378 of the insulating fabric 375. In some embodiments, the inner portions 373, 374 can extend under a portion of most or all of the photovoltaic cells 123 allowing the inner portions 373, 374 to serve as a barrier foil for the photovoltaic sub-module 120. In some embodiments, when the conductors 371, 372 can serve as an effective barrier foil to protect the photovoltaic modules from moisture, the back sheet 335 can be omitted. In embodiments in which a porous conductive layer, such as the conductive mesh 178M described above, is used for the conductors 371, 372, then it may be preferable to include the back sheet 335. In some embodiments in which the conductive layers of the fabric, such as the conductors 371, 372, cannot serve as effective barrier layers, a back sheet can be placed outward of the conductive layer (i.e., the conductive layer can be disposed between the photovoltaic modules and the back sheet).

A bypass diode 199 described above in reference to FIG. 1A can be connected between the inner portion 373 of the first conductor 371 and the inner portion 374 of the second conductor 372. In some embodiments, the spacing between the inner portion 373 of the first conductor 371 and the inner portion 374 of the second conductor 372 can be designed so that the diode 199 can be directly connected to the inner portions 373, 374. Thus, the conductors 371, 372 can serve as barrier foils and the bypass diode 199 may be connected to the conductors without any additional wiring.

In some embodiments, the conductors 371, 372 can further include a respective protruding portion 376, 379 extending through the insulating fabric 375, the adhesive 345, the back sheet 335, the edge seal 360, and the front-side adhesive 340 to connect to the respective ends 121, 122 of the photovoltaic sub-module 120. In some embodiments, the photovoltaic modules 310 are placed on the fabric 370, and then the edge seal 360 is added to encapsulate the protruding portions 376, 379 of the respective conductors 371, 372 and at least a portion of the photovoltaic modules 310.

Figure 3B:
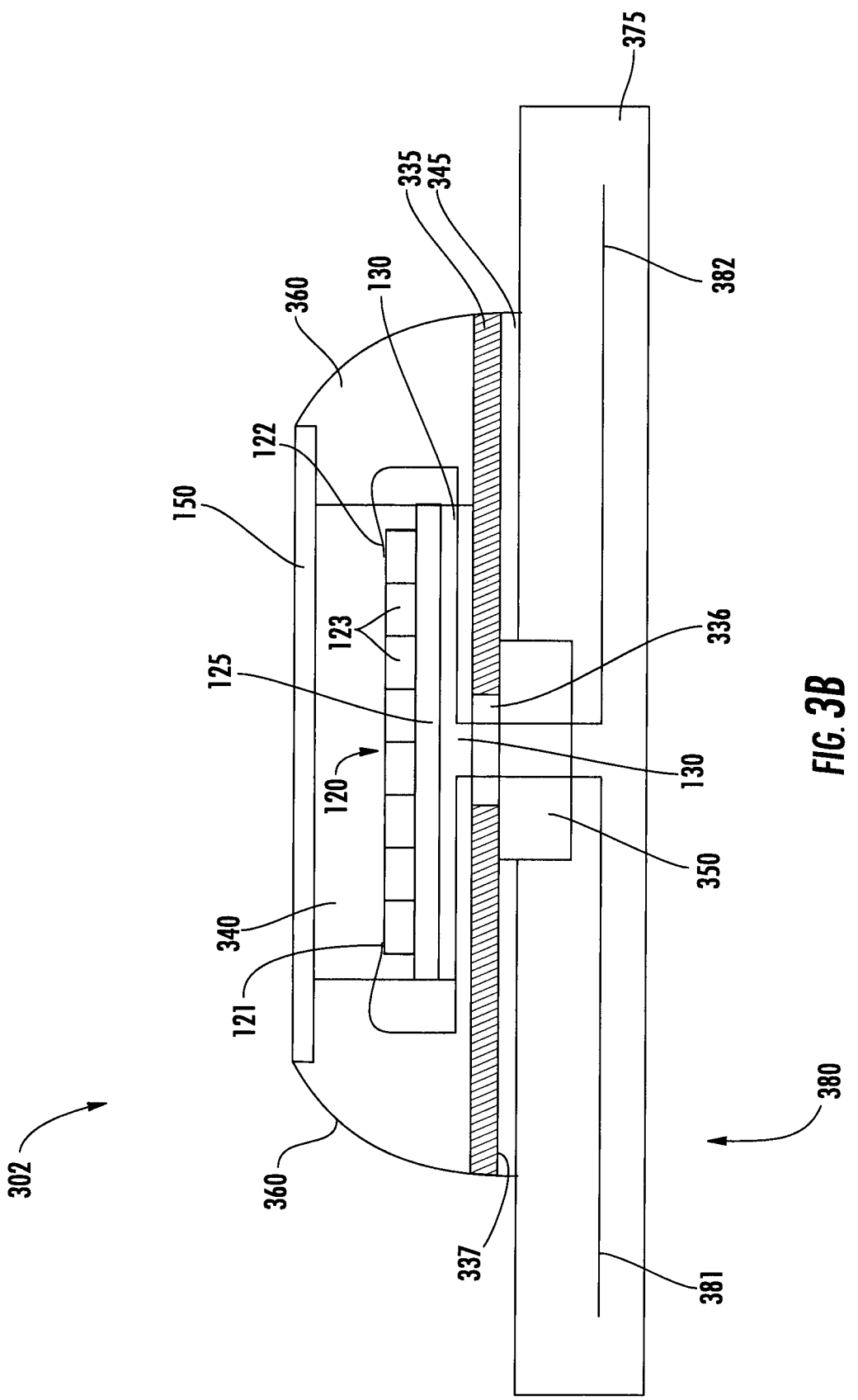
FIG. 3B is a cross sectional view of a flexible photovoltaic module assembly, according to another embodiment.

FIG. 3B is a cross sectional view of a flexible photovoltaic module assembly 302, according to another embodiment. The photovoltaic module assembly 302 is similar to the photovoltaic module assembly 301 described above except that the photovoltaic module assembly 302 includes a junction box 350 that is used to electrically connect the photovoltaic sub-module(s) 120 to the conductors of a fabric 380 to which the photovoltaic sub-module 120 is mounted. The fabric 380 is similar to the fabric 370 described above in reference to FIG. 3A except that the fabric 380 includes different conductors. The fabric 380 includes conductors 381, 382 that are routed through the junction box 350. The junction box 350 can be attached to a surface 337 (e.g., a lower surface) of the back sheet 335 facing away from the photovoltaic sub-module 120. The back sheet 335 includes an opening 336 for routing the conductors 381, 382 to the photovoltaic sub-module 120. The conductors 381, 382 extend from the fabric 380 into the junction box 350, through the opening in the back sheet 335, through the back-side adhesive 130, through the edge seal 360 and front-side adhesive 140 and to the separate ends 121, 122 of the photovoltaic sub-module 120.

Figure 3C:
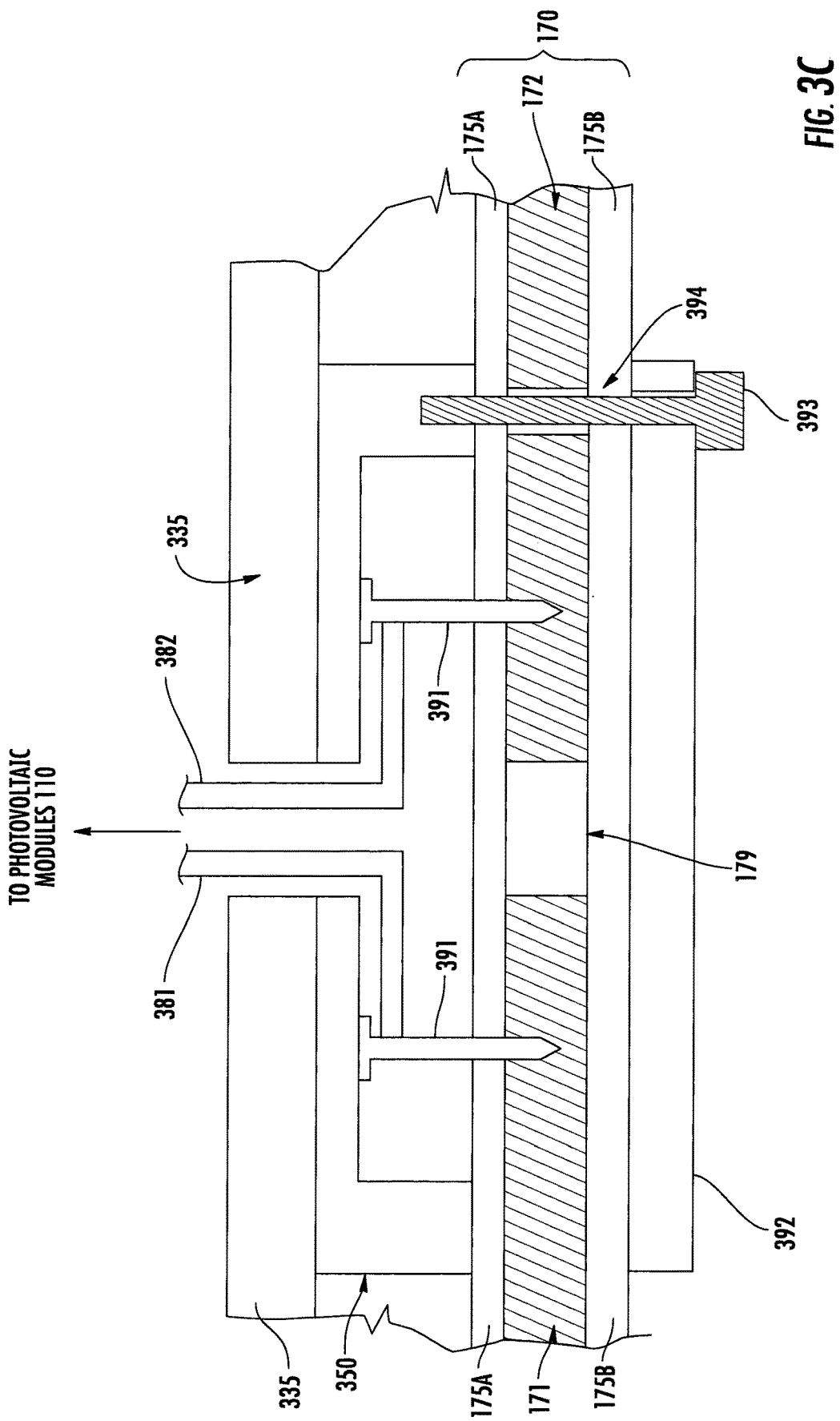
FIG. 3C is a cross sectional view of a flexible photovoltaic module assembly, according to another embodiment.

In another embodiment, as illustrated in FIG. 3C, a photovoltaic module 303 includes a junction box 350 located at an opening through the back sheet 335 which can be mechanically attached to a fabric 170 that has a pair of conductors (e.g., conductive fabrics 171, 172) for connecting to the opposing ends 121, 122 of the photovoltaic modules 110. The opposing ends 121, 122 of the photovoltaic module 110 can be connected by use of two or more conduction pins 391 (e.g., metal pins, rods, etc.) that extend within the junction box 350. The conduction pins 391 can be inserted through a first side of the fabric 170 to make electrical contact with the conductors in the fabric 170. A plate 392 on an opposing second side of the fabric 170 can be fastened to the junction box 350 by use of fastener 393 to secure the photovoltaic module(s) to the fabric 170. The fasteners 393 can extend through the insulating material of the fabric 170 and holes 394 formed within conductive elements within the fabric 170 to connect to the junction box 350 to the fabric 170. For example, a threaded fastener may be fastened to internal threads formed in the junction box 350. This embodiment allows the photovoltaic modules and the fabric having the internal conductors to be separately formed and then quickly connected to each other. Furthermore, the use of fasteners 393 allows easy replacement of a photovoltaic module assembly.

Figure 3D:
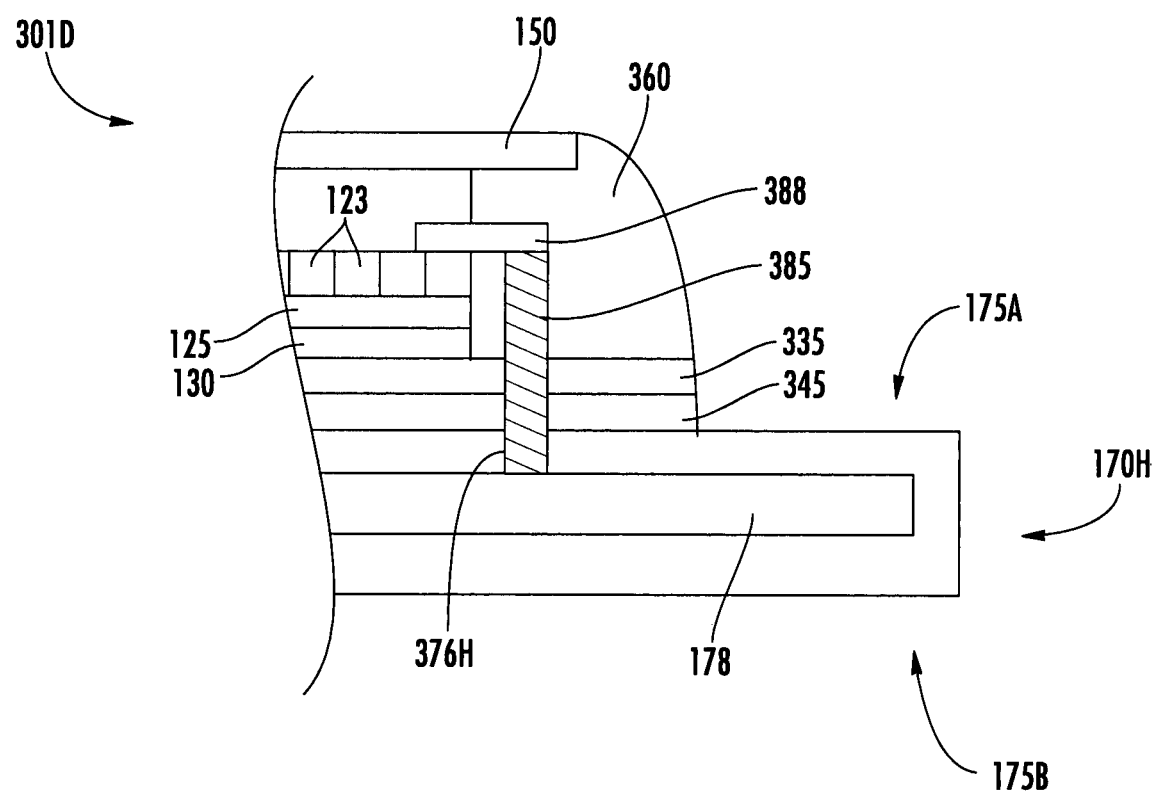
FIG. 3D is a cross sectional view of a flexible photovoltaic module assembly, according to another embodiment.

FIG. 3D is a top view of a photovoltaic module assembly 301D, according to one embodiment. The photovoltaic module assembly 301D is similar to the photovoltaic assembly 301 described above except that a different fabric is used and different components are used to make the electrical connection between the conductor in the fabric and the array of photovoltaic cells 123. The photovoltaic module assembly 301D includes the fabric 170h described above. This embodiment of the fabric 170h includes the bottom insulating layer 175B and the top insulating layer 175A. The fabric 170h may further include holes 376h through the top insulating layer 175A so as to expose a portion of the conductors 178. To make an electrical connection between the conductor 178 and the array of photovoltaic cells 123, the photovoltaic module assembly 301D further includes a busbar 388 that is electrically connected to an end of the array of photovoltaic cells 123 in a sub-module. A conductive adhesive 385 can then be disposed so that it extends between the busbar 388 and the conductor 178 disposed in the fabric 170h to electrically connect the busbar 388 and the conductor 178. Corresponding holes can be added to other layers (e.g., the back sheet 335) in the photovoltaic module assembly 301D to create a conductive path between the busbar 388 and the conductor 178 in the fabric 170h through the conductive adhesive 385.

FIG. 4 is a cross sectional view of a flexible photovoltaic module assembly 400, according to another embodiment. The photovoltaic module assembly 400 is similar to the photovoltaic module assembly 201 described above except that the photovoltaic module assembly 400 includes a keder 450 at one end of the photovoltaic module assembly 400 in the X-direction. The photovoltaic module assembly 400 may also include additional photovoltaic modules 110 (not shown) that are spaced apart from the photovoltaic module 110 shown in FIG. 4 in the X-direction and/or the Y-direction. The keder 450 can be used to secure or mount the photovoltaic module assembly 400 to another structure. For example, the keder 450 can be positioned in a corresponding groove or other fixation profile (not shown) for mounting the photovoltaic module assembly 400 to a wall, building, building façade or other similar structure.

The photovoltaic module assembly 400 includes a fabric 470 that is similar (e.g., similar materials for the conductive layers and insulating fabric) to the fabric 270 described above in reference to FIGS. 1N-1O and 2A. The fabric 470 includes a first conductive layer 471 and a second conductive layer 472. The first conductive layer 471 extends from the first end 121 of the photovoltaic sub-module 120 towards another photovoltaic module 110 (not shown). The second conductive layer 472 extends from the second end 122 of the photovoltaic sub-module 120 to the keder 450. The keder 450 includes a core 455 that can be formed of a conductive material, such as rigid conductive material (e.g., a metal tube or bar). The second conductive layer 472 can be disposed around the core 455 to make contact with the core 455. Insulating fabric 475, which is similar to at least a portion of the insulating fabric 175 described above, can surround the second conductive layer 472 and the core 455 to form the outer portion of the keder 450. The core 455 can be electrically connected to external equipment, such as a charge controller or other electronics to charge a power source (e.g., a battery bank). Thus, the core 455 formed of a rigid, conductive material can provide mechanical strength to secure the photovoltaic module assembly 400 to the corresponding receiving element, groove or other fixation profile (not shown) and also form part of the electrical circuit connected to the photovoltaic sub-module 120. Furthermore, use of one or more keders 450 (e.g., a keder 450 at either end of the photovoltaic module assembly 400 in the X-direction) built into the photovoltaic module assembly 400 can increase the speed at which the photovoltaic module assembly 400 is installed to form a roof, façade, wall, or other structure as the one or more keders 450 can reduce the process of mounting the photovoltaic module assembly 400 to simply inserting the keders 450 into one or more corresponding receiving element, groove or other fixation profile.

While the foregoing is directed to embodiments of the present disclosure, other and further embodiments of the disclosure may be devised without departing from the basic scope thereof, and the scope thereof is determined by the claims that follow.

What is claimed is:

1. A flexible photovoltaic apparatus, comprising:
   a photovoltaic device comprising an array of photovoltaic cells having a first end and a second end, the array extending in a first direction from the first end to the second end; and
   a first fabric comprising:
      a top insulating layer;
      a bottom insulating layer;
      a first conductor disposed between the top insulating layer and the bottom insulating layer, the first conductor connected to the first end of the array of photovoltaic cells; and
      a second conductor disposed between the top insulating layer and the bottom insulating layer, the second conductor connected to the second end of the array of photovoltaic cells;
   wherein
      the top insulating layer and the bottom insulating layer are different layers,
      the photovoltaic device is coupled to the first fabric,
      the top insulating layer is disposed around a core to form a keder,
      the core is formed of rigid, electrically conductive material, and
      the core is connected to the second conductor.

2. The flexible photovoltaic apparatus of claim 1, wherein the first fabric includes a recess and the photovoltaic device is disposed in the recess.

3. The flexible photovoltaic apparatus of claim 2, further comprising a diode connected between the first conductor and the second conductor.

4. The flexible photovoltaic apparatus of claim 1, wherein the top insulating layer includes a first channel extending in a second direction substantially perpendicular to the first direction, the first channel exposing a surface of the first conductor.

5. The flexible photovoltaic apparatus of claim 4, wherein the top insulating layer includes a second channel extending in the second direction, the second channel exposing a surface of the second conductor.

6. The flexible photovoltaic apparatus of claim 1, wherein
   the photovoltaic device is disposed on the first fabric,
   the top insulating layer includes a first surface facing the photovoltaic device and a second surface opposite to the first surface,
   the first conductor includes a first inner portion extending between two or more photovoltaic cells of the array and the second surface, and the second conductor includes a second inner portion extending between two or more photovoltaic cells of the array and the second surface.

7. The flexible photovoltaic apparatus of claim 6, further comprising a diode connected between the first inner portion of the first conductor and the second inner portion of the second conductor.

* * * * *